United States Patent
Roth

(10) Patent No.: US 8,462,022 B2
(45) Date of Patent: Jun. 11, 2013

(54) CONTROL UNIT FOR DOMESTIC APPLIANCES

(75) Inventor: Bernhard Roth, Oberderdingen (DE)

(73) Assignee: E.G.O. Elektro-Geraetebau GmbH, Oberderdingen (DE)

( * ) Notice: Subject to any disclaimer, the term of this patent is extended or adjusted under 35 U.S.C. 154(b) by 1235 days.

(21) Appl. No.: 12/268,746

(22) Filed: Nov. 11, 2008

(65) Prior Publication Data

US 2009/0115645 A1    May 7, 2009

Related U.S. Application Data

(63) Continuation of application No. PCT/EP2007/004188, filed on May 11, 2007.

(30) Foreign Application Priority Data

May 12, 2006   (DE) .......................... 10 2006 022 965

(51) Int. Cl.
*H03K 17/94* (2006.01)
*H03M 11/00* (2006.01)
*G06F 3/02* (2006.01)
*G09G 5/00* (2006.01)
*H01H 9/00* (2006.01)

(52) U.S. Cl.
USPC ............. 341/33; 345/170; 200/310; 200/311; 200/313

(58) Field of Classification Search
USPC .......................... 200/310, 311, 313, DIG. 36
See application file for complete search history.

(56) References Cited

U.S. PATENT DOCUMENTS

| 4,001,536 | A | * | 1/1977 | Eberhardt, Jr. ................. 219/719 |
| 4,121,204 | A | * | 10/1978 | Welch et al. .................. 345/174 |
| 4,146,883 | A | | 3/1979 | Appeldorn et al. |
| 4,221,328 | A | | 9/1980 | Kramer |
| 5,155,338 | A | * | 10/1992 | Hoffmann .................. 219/445.1 |
| 5,917,165 | A | | 6/1999 | Platt et al. |

(Continued)

FOREIGN PATENT DOCUMENTS

| DE | 40 07 971 A1 | 9/1991 |
| EP | 1 542 363 A1 | 6/2005 |
| JP | 2002373540 A | 12/2002 |
| JP | 2003178657 A | 6/2003 |

OTHER PUBLICATIONS

Japan Patent Office Action for Japanese Application No. 2009-508255, dated Feb. 7, 2012.

(Continued)

*Primary Examiner* — Daniel Wu
*Assistant Examiner* — Emily C Terrell
(74) *Attorney, Agent, or Firm* — Alston & Bird LLP

(57) ABSTRACT

A control unit comprising a light guide is formed and positioned in a circuit board for providing visual indication to a user of an appliance, such as a cooktop. The light guide receives light from a source, typically in the form of an LED on the circuit board, typically positioned laterally to the light guide, and the light guide receives and directs the light to the user. In some embodiments, the light guide is positioned behind a cover, which may have indicia thereon for providing operating information to the user. Portions of the light guide may be coated with an electrically conductive coating so as to also form a portion of a capacitance touch switch for detecting user input for controlling operation of the appliance.

9 Claims, 2 Drawing Sheets

U.S. PATENT DOCUMENTS

| | | |
|---|---|---|
| 6,403,904 B1 | 6/2002 | Schilling |
| 6,664,489 B2 | 12/2003 | Kleinhans et al. |
| 6,723,937 B2 | 4/2004 | Englemann et al. |
| 6,930,287 B2 * | 8/2005 | Gerola et al. ............. 219/447.1 |
| 7,142,189 B2 * | 11/2006 | Engelmann ................. 345/102 |
| 7,242,393 B2 | 7/2007 | Caldwell |
| 7,923,654 B2 * | 4/2011 | Zeijlon et al. ................ 200/600 |
| 8,017,890 B2 * | 9/2011 | Paradiso et al. ........... 219/457.1 |
| 2002/0117497 A1 * | 8/2002 | Bassill et al. ................ 219/626 |
| 2002/0167704 A1 | 11/2002 | Kleinhans et al. |
| 2003/0193013 A1 | 10/2003 | Balp et al. |
| 2003/0210537 A1 | 11/2003 | Engelmann |
| 2005/0213799 A1 * | 9/2005 | Sawano ....................... 382/124 |
| 2007/0068789 A1 | 3/2007 | Streifler |
| 2008/0084365 A1 * | 4/2008 | Takahara et al. ............... 345/76 |

OTHER PUBLICATIONS

International Search Report from PCT/EP2007/004188 dated Sep. 19, 2007.

German Search Report from German Application No. 10 2006 022 965.7.

* cited by examiner

CONTROL UNIT FOR DOMESTIC APPLIANCES

CROSS REFERENCE TO RELATED APPLICATIONS

This application is a continuation of PCT/EP2007/004188, filed May 11, 2007, which in turn claims priority to DE 10 2006 022 965.7, filed on May 12, 2006, the contents of both of which are incorporated by reference.

FIELD OF THE INVENTION

The invention relates to a control unit for domestic appliances, in particular for cooktops, for installation behind a cover of the domestic appliance.

BACKGROUND OF THE INVENTION

Such control units generally comprise control elements for controlling functions of the domestic appliance. In the case of cooktops, it is possible to provide a control element that operates the respective hot plate of the cooktop, to activate or deactivate the hot plate, and to set the power.

In the case of cooktops, the control unit can be provided within, or on the edge of, the so-called stovetop behind a cover in the form of a glass-ceramic plate. Capacitive sensor elements are generally used as control elements, the capacitance of which changes depending on actuation or operation. This change in capacitance can be processed by an associated control unit and converted into appropriate control commands.

Since such capacitive control elements generally do not provide a tactile response when being actuated, and therefore luminous means, such as LEDs, are associated with the control elements or sensor elements. Their optical state can correspond to the actuating state or can visually indicate activation or deactivation or power setting effected by the actuation.

Such a control unit with illuminated or background-illuminated, capacitive control elements or sensor elements is disclosed in DE 103 26 684 A1. Provision is made for the control unit to be installed behind a cover in the form of a glass-ceramic plate of the domestic appliance and to have fitted a transparent, capacitive sensor element in the form of a conductive foil, which in the assembled state of the control unit is positioned on the rear face of the cover, that is to say, on the side facing away from the user. A luminous means is associated with the sensor element, for example in the form of an LED, with the light emitted laterally or parallel to the cover by the LED being deflected in the direction of the cover and scattered by an light guide. As seen from the cover, the light guide is arranged flush behind the sensor element. Since the sensor element is transparent, it can thus be backlit or have background lighting. The LED and the light guide are arranged on a side of a circuit board facing the cover. The sensor element contacts the circuit board via associated contact means or plug connectors, with the sensor signal at the sensor element being fed to a control unit for evaluation, through tracks of the circuit board.

If such a control unit is intended to be arranged in an edge area of the glass-ceramic plate or outside of the glass-ceramic plate, an overall physical height of the control element, which results from the sum of the thickness of the circuit board, the height or the thickness of the light guide and the thickness of the sensor element, must be smaller than 4 mm, for example. However, this is difficult to implement using the control unit shown in DE 103 26 684 A1, since the height or thickness of the light guide cannot be reduced arbitrarily due to the desired imaging characteristics.

Furthermore, the control unit shown requires a special interface or a special plug connector between the sensor element and circuit board.

BRIEF DESCRIPTION OF THE DRAWINGS

Exemplary embodiments of the invention will be explained in more detail in the following text and are illustrated schematically in the drawings, in which.

DETAILED DESCRIPTION OF THE EXEMPLARY EMBODIMENTS

Figure 1:
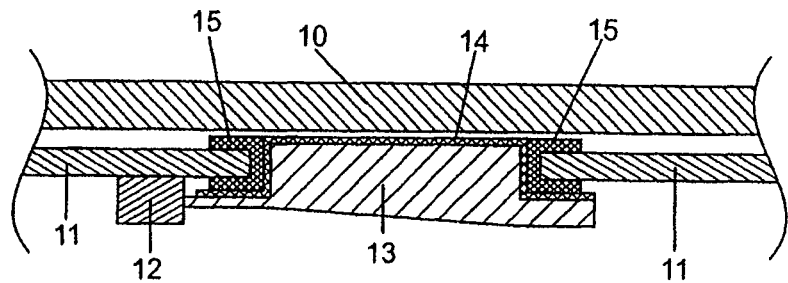
FIG. 1 shows a section through part of a control unit for cooktops according to a first embodiment.

One aspect of the invention is based on the object of providing a control unit for domestic appliances of the type mentioned initially, which has a very low build height and allows the sensor element to make contact with the circuit board relatively easily.

This object is achieved in one embodiment by the invention by a control unit according to claim 1. Advantageous and preferred refinements of the invention are the subject matter of the dependent claims and are described in more detail in the following text. The wording of the claims is expressly incorporated by reference in the contents of the description.

The control unit has at least one sensor element for generating an actuation-dependent sensor signal, at least one luminous means associated with the sensor element, at least one light guide associated with the luminous means for changing the direction of the light entering the light guide with respect to the light emitted by the light guide, and a circuit board, on which the luminous means, the sensor element and the light guide are arranged. According to one embodiment of the invention, the luminous means is arranged on a side of the circuit board which is intended to face away from the cover, that is to say on that side of the circuit board which in the installed state of the control unit faces away from the cover. The light guide is arranged at least in part in an aperture opening of the circuit board, with, for example, a round or oval cross section, or is pushed through the aperture opening. The light guide has a conductive, substantially flat, surface on a side intended to face the cover which at least in part forms the sensor element. Arranging the light guide in the opening in the circuit board reduces the required build height by the thickness of the circuit board compared to the embodiment described in DE 103 26 684 A1. The conductive surface of the light guide forms the sensor element at least in part, as a result of which the effective sensor area can be increased compared to a case in which only conductive surfaces on the circuit board are provided as a sensor element.

In another embodiment, the sensor element is a capacitive sensor element for generating an actuation-dependent capacitance. In this case, the conductive surface of the light guide forms one plate of a capacitor.

In another embodiment, the conductive surface is formed by coating the light guide on the side which is intended to face the cover with a conductive coating which is transparent at least in parts. By way of example, the coating can be applied to the light guide by printing or vapor deposition. Indium tin oxide (ITO) is a possible coating material. If non-transparent regions are provided on the surface of the light guide, these can be used for displaying characters, symbols, and so forth.

In another embodiment, the light guide is electrically conductive. In this manner, the light guide fulfills a dual-function as a light guide and a sensor element. A coating with a conductive layer is not necessary in this case.

In another embodiment, the light entering the light guide with respect to the light emitted by the light guide undergoes a directional change of 90 degrees. In this manner, it is possible, for example, for light generated by a so-called side-LED to be deflected by the light guide in the direction of the cover and scattered so that this results in a button being backlit over a large region despite a more or less punctiform radiation source.

In another embodiment, the luminous means is an LED.

In another embodiment, areas of the circuit board adjacent to the light guide are coated to be electrically conductive.

In another embodiment, areas of the light guide adjacent to the circuit board are coated to be electrically conductive. In this manner, simple and reliable contact can be made between the sensor element or the conductive surface of the light guide and the circuit board, in combination with an appropriate conductive coating of the corresponding surfaces of the circuit board, without specific plug connectors or the like being necessary.

In another embodiment, a conductive contact surface is provided around the aperture opening on the circuit board on the side which is intended to face the cover and is in electrical contact with the conductive surface of the light guide, with the conductive surface of the light guide and the contact surface forming the sensor element. Such contact surfaces can also be provided on both sides of the circuit board in the region of the aperture opening.

These and further features are described not only in the claims, but also in the description and the drawings, in which case the individual features can each be implemented in their own right or in groups in the form of sub-combinations for an embodiment of the invention or in other fields, and may represent advantageous embodiments, worthy of protection in their own right, for which protection is claimed here. The subdivision of the application into individual sections and the intermediate headings do not restrict the generality of the statements made therein.

Turning now to the figures, FIG. 1 shows a section through part of a control unit for cooktops for installation behind a cover in the form of a glass-ceramic plate 10 of the cooktop according to a first embodiment. By way of example, the control unit is used to select a hot plate and to select the power of a respective hot plate.

In order to simplify the description, only the elements of the control unit essential to the invention are illustrated. It is understood that, in addition to the elements shown, it is possible that provision is made for further elements which are not shown, such as further sensor elements, further LEDs, interfaces and/or a microprocessor for evaluating sensor signals.

The control unit illustrated comprises a circuit board 11 as a mount medium for a capacitive sensor element for generating an actuation-dependent sensor signal, for a luminous means associated with the sensor element in the form of an LED 12 and for a light guide 13 associated with the luminous means which effects a change in direction through approximately 90° of the light, which is generated by the LED 12 and enters the light guide 13, with respect to the light emitted by the light guide in the direction of the cover 10 and which effects uniform lighting over a large area of the surface of the light guide facing the cover.

The LED 12 is arranged on a lower or back side of the circuit board 11, that is, on a side of the circuit board 11 which faces away from the cover 10 in the installed state of the control unit.

The light guide 13 is arranged in an oval aperture opening of the circuit board 11, and its upper region may extend through this opening. The light guide 13 completely fills the aperture opening.

On a side facing the cover 10, the light guide 13 has a flat surface which is covered with a conductive, transparent coating 14 and is part of the capacitive sensor element, or forms the latter in part. This surface of the light guide can in addition have an opaque print, a mask, etc. which is applied above the conductive coating 14 in the direction of the cover. Any desired symbols, characters, etc. can be generated in this manner.

Areas of the light guide 13 adjacent to the circuit board 11 are likewise provided with the conductive, transparent coating 14, that is to say they are coated in an electrically conductive manner.

Areas of the circuit board 11 which are aligned perpendicular and are adjacent to the light guide 13, that is to say the side walls of the aperture opening, and horizontal contact surfaces in a region around the aperture opening on the upper and lower side of the circuit board 11 are conductively coated, and make an electrical connection between the conductive, transparent coating 14 and the adjacent conductive areas or coatings of the circuit board 11. On the one hand, this means that the conductive surface 14 of the light guide 13 and the contact surfaces 15 form the capacitive sensor element. Furthermore, this thus makes contact between the conductive coating 14 and the circuit board possible without further plug connectors, with associated tracks on the circuit board (not shown) feeding a sensor signal to an evaluation unit (not shown).

Figure 2:
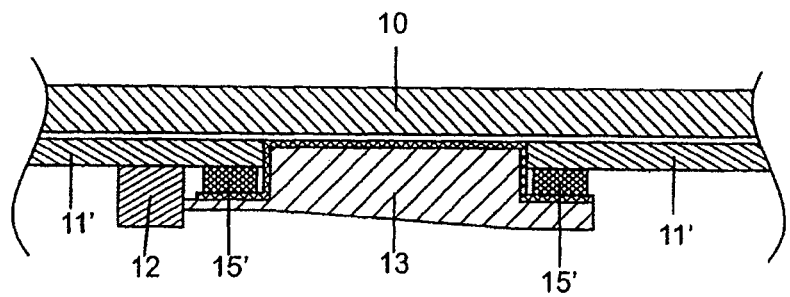
FIG. 2 shows a section through part of a control unit for cooktops according to a further embodiment with a circuit board which is coated on one side with copper.

FIG. 2 shows a section through part of a control unit for cooktops according to a further embodiment with a circuit board 11' which is coated on one side with copper. For financial reasons, the circuit board is coated with copper only on its underside, that is to say on the side facing away from the cover 10. The circuit board makes electrical contact with the conductive coating 14 of the light guide 13 via contact surfaces 15' on the underside which form a conductive flange in the region around the aperture opening. Otherwise, the embodiment illustrated in FIG. 2 corresponds to the embodiment illustrated in FIG. 1.

Figure 3:
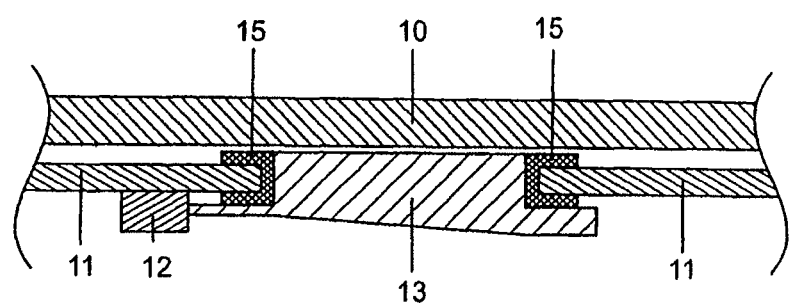
FIG. 3 shows a section through part of a control unit for cooktops according to a further embodiment in which the light guide itself is conductive.

FIG. 3 shows a section through part of a control unit for cooktops according to a further embodiment, in which the light guide itself is conductive. In this embodiment, the conductive coating 14 on the light guide 13 can be dispensed with, since the light guide 13 itself is conductive.

In the embodiments illustrated, a single luminous means 12 is shown which is associated with a light guide 13 which opts on its outlet side, or outlet face, which faces the cover 10 a large-area image of the point radiation source 13. In addition or alternately, provision can be made for a plurality of luminous means per light guide 13, which luminous means feed their light into one or more entry openings, which light in turn is emitted from one or more outlet openings, or outlet faces, of the light guide. In this manner, a number of colors can be emitted, for example through the light guide, or the brightness of the light emitted through the light guide can be adapted. Furthermore, symbols, characters and/or shapes, etc. can be selectively illuminated by using groups of outlet openings.

That is to say any desired, wanted light effects can be generated by design refinements of the light guide.

The light guide or aperture opening may have an oval shape in a plan view. It is self-evident that the light guide or the aperture opening can have any desired shape; for example, it can be round, rectangular or triangular.

The embodiments shown have a low physical height despite large-area background illumination of a button formed by the sensor element, since the total physical height is reduced by the thickness of the circuit board compared to a conventional embodiment, due to the arrangement of the light guide 13 in the aperture opening of the circuit board 11. This allows an operating unit according to the invention to be installed in an edge area, or outside, of a glass-ceramic region of a cooktop. Furthermore, contact between the sensor element and the circuit board is simplified, since no special plug connectors are required.

The invention claimed is:

1. A control unit for a domestic appliance comprising a cooktop, said control unit for installation behind a cover of the domestic appliance, said control unit comprising:
   - at least one sensor element for generating an actuation-dependent sensor signal;
   - at least one luminous source associated with the sensor element;
   - at least one light guide associated with the luminous source for changing the direction of the light emitted by the light guide with respect to the light entered by the light guide; and
   - a circuit board, on which the luminous source, the light guide and the sensor element are arranged, wherein
   - the luminous source is arranged on a side of the circuit board which faces away from the cover,
   - the light guide is arranged at least in part in an aperture opening of the circuit board and
   - the light guide has a conductive, substantially flat surface on a side facing the cover, with the sensor element formed at least in part by the conductive surface.

2. The control unit of claim 1, wherein the sensor element is a capacitive sensor element generating an actuation-dependent capacitance.

3. The control unit of claim 1, wherein the conductive surface is formed by coating the light guide on the side facing the cover with a conductive coating that is transparent at least at certain parts.

4. The control unit of claim 1 wherein the light guide is electrically conductive.

5. The control unit of claim 1 wherein the directional change of the light entering the light guide with respect to the light emitted by the light guide is 90 degrees.

6. The control unit of claim 5 wherein the luminous source is an LED.

7. The control unit of claim 1 wherein an area of the circuit board adjacent to the light guide comprises an electrically conductive coating.

8. The control unit of claim 1 wherein an area on the light guide adjacent to the circuit board comprises an electrically conductive coating.

9. The control unit of claim 1 wherein a conductive contact surface is provided around the aperture opening on the circuit board on the side facing the cover and makes electrical contact with the conductive surface of the light guide, wherein the sensor element is formed by the conductive surface of the light guide and the contact surface.

\* \* \* \* \*